US008563095B2

(12) United States Patent
Rajagopalan et al.

(10) Patent No.: US 8,563,095 B2
(45) Date of Patent: Oct. 22, 2013

(54) SILICON NITRIDE PASSIVATION LAYER FOR COVERING HIGH ASPECT RATIO FEATURES

(75) Inventors: Nagarajan Rajagopalan, Santa Clara, CA (US); Xinhai Han, Sunnyvale, CA (US); Ryan Yamase, Santa Clara, CA (US); Ji Ae Park, Santa Clara, CA (US); Shamik Patel, Redlands, CA (US); Thomas Nowak, Cupertino, CA (US); Zhengjiang "David" Cui, San Jose, CA (US); Mehul Naik, San Jose, CA (US); Heung Lak Park, Santa Clara, CA (US); Ran Ding, Sunnyvale, CA (US); Bok Hoen Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 319 days.

(21) Appl. No.: 12/724,396

(22) Filed: Mar. 15, 2010

(65) Prior Publication Data
US 2011/0223765 A1    Sep. 15, 2011

(51) Int. Cl.
*H05H 1/24* (2006.01)
*C23C 16/34* (2006.01)

(52) U.S. Cl.
USPC ........ 427/579; 427/96.8; 427/98.8; 427/99.2; 427/255.393; 427/255.394; 427/535

(58) Field of Classification Search
USPC .................. 427/535, 579, 96.8, 98.8, 99.2, 427/255.393, 255.394
See application file for complete search history.

(56) References Cited

U.S. PATENT DOCUMENTS

| | | | |
|---|---|---|---|
| 4,089,992 A | 5/1978 | Doo et al. | |
| 4,118,539 A | 10/1978 | Hirai et al. | |
| 4,279,947 A | 7/1981 | Goldman et al. | |
| 4,395,438 A | 7/1983 | Chiang | |
| 4,435,898 A | 3/1984 | Gaur et al. | |
| 4,549,064 A | 10/1985 | Delfino | |
| 4,618,541 A * | 10/1986 | Forouhi et al. | 428/688 |
| 4,624,736 A | 11/1986 | Gee et al. | |
| 4,665,426 A * | 5/1987 | Allen et al. | 257/323 |
| 4,717,602 A | 1/1988 | Yamazaki | |
| 4,877,651 A | 10/1989 | Dory | |
| 4,894,352 A | 1/1990 | Lane et al. | |
| 4,948,482 A | 8/1990 | Kobayashi et al. | |
| 5,306,946 A | 4/1994 | Yamamoto | |
| 5,627,403 A | 5/1997 | Bacchetta et al. | |
| 5,877,095 A | 3/1999 | Tamura et al. | |
| 5,962,344 A * | 10/1999 | Tu et al. | 438/694 |
| 5,970,384 A | 10/1999 | Yamazaki et al. | |
| 5,985,771 A | 11/1999 | Moore et al. | |
| 6,001,728 A * | 12/1999 | Bhan et al. | 438/624 |
| 6,017,614 A | 1/2000 | Tsai et al. | |
| 6,046,398 A * | 4/2000 | Foote et al. | 136/201 |
| 6,162,709 A | 12/2000 | Raoux et al. | |
| 6,271,146 B1 | 8/2001 | Ross | |
| 6,316,820 B1 * | 11/2001 | Schmitz et al. | 257/649 |
| 6,342,456 B1 | 1/2002 | Jenkins et al. | |
| 6,358,670 B1 | 3/2002 | Wong et al. | |
| 6,368,931 B1 | 4/2002 | Kuhn et al. | |
| 6,372,291 B1 | 4/2002 | Hua et al. | |
| 6,372,672 B1 | 4/2002 | Kim et al. | |
| 6,436,825 B1 * | 8/2002 | Shue | 438/687 |
| 6,518,167 B1 | 2/2003 | You et al. | |
| 6,548,899 B2 | 4/2003 | Ross | |
| 6,566,278 B1 | 5/2003 | Harvey et al. | |
| 6,582,777 B1 | 6/2003 | Ross et al. | |
| 6,673,724 B2 | 1/2004 | Forster et al. | |
| 6,992,021 B2 * | 1/2006 | Lin et al. | 438/775 |
| 7,247,582 B2 | 7/2007 | Stern et al. | |
| 7,323,391 B2 | 1/2008 | Arghavani et al. | |
| 7,416,995 B2 | 8/2008 | Iyer et al. | |
| 7,563,680 B2 | 7/2009 | Arghavani et al. | |
| 7,566,655 B2 | 7/2009 | Balseanu et al. | |
| 8,283,237 B2 * | 10/2012 | Rajagopalan et al. | 438/455 |
| 8,329,575 B2 * | 12/2012 | Rajagopalan et al. | 438/643 |
| 2002/0052124 A1 * | 5/2002 | Raaijmakers et al. | 438/778 |
| 2002/0053720 A1 | 5/2002 | Boursat et al. | |
| 2003/0087522 A1 * | 5/2003 | Ngo et al. | 438/660 |

(Continued)

FOREIGN PATENT DOCUMENTS

EP          0303508         2/1989
KR   10-2008-0060365 A     7/2008

(Continued)

OTHER PUBLICATIONS

Lee, S.H., et al., "Silicon nitride films prepared by high-density plasma chemical vapor deposition for solar cell applications". Surface and Coatings Technology 153 (2002) 67-71.*

Nursam, Natalita M., et al., "PECVD Silicon Nitride Passivation on Boron Emitter: The Analysis of Electrostatic Charge on the Interface Properties". Advances in OptoElectronics, vol. 2010, Article ID 487406, pp. 1-8.*

Miyazaki, Hiroshi, et al., "Passivation effect of silicon nitride against copper diffusion". J. Appl. Phys. 81 (12), Jun. 15, 1997, pp. 7746-7750.*

(Continued)

*Primary Examiner* — Bret Chen
(74) *Attorney, Agent, or Firm* — Ashok K. Janah; Janah & Associates, P.C.

(57) ABSTRACT

A method of forming a passivation layer comprising silicon nitride on features of a substrate is described. In a first stage of the deposition method, a dielectric deposition gas, comprising a silicon-containing gas and a nitrogen-containing gas, is introduced into the process zone and energized to deposit a silicon nitride layer. In a second stage, a treatment gas, having a different composition than that of the dielectric deposition gas, is introduced into the process zone and energized to treat the silicon nitride layer. The first and second stages can be performed a plurality of times.

35 Claims, 5 Drawing Sheets

(56) References Cited

U.S. PATENT DOCUMENTS

| | | | |
|---|---|---|---|
| 2003/0192858 A1* | 10/2003 | Donohoe et al. | 216/67 |
| 2003/0207033 A1 | 11/2003 | Yim et al. | |
| 2003/0215570 A1 | 11/2003 | Seutter et al. | |
| 2004/0009680 A1 | 1/2004 | Luo et al. | |
| 2004/0083964 A1 | 5/2004 | Ingle et al. | |
| 2004/0099915 A1 | 5/2004 | Takayama et al. | |
| 2004/0101632 A1 | 5/2004 | Zhu et al. | |
| 2004/0121085 A1 | 6/2004 | Wang et al. | |
| 2004/0152338 A1 | 8/2004 | Gaillard et al. | |
| 2004/0157453 A1 | 8/2004 | Delgadino et al. | |
| 2004/0173570 A1 | 9/2004 | Ying et al. | |
| 2004/0173907 A1* | 9/2004 | Chen et al. | 257/758 |
| 2005/0109276 A1 | 5/2005 | Iyer et al. | |
| 2005/0170104 A1 | 8/2005 | Jung et al. | |
| 2005/0242376 A1 | 11/2005 | Chen et al. | |
| 2005/0247986 A1 | 11/2005 | Ko et al. | |
| 2005/0255667 A1 | 11/2005 | Arghavani et al. | |
| 2005/0266632 A1 | 12/2005 | Chen et al. | |
| 2005/0285187 A1 | 12/2005 | Bryant et al. | |
| 2006/0084236 A1* | 4/2006 | Vogt | 438/381 |
| 2006/0105106 A1 | 5/2006 | Balseanu et al. | |
| 2006/0110862 A1* | 5/2006 | Gan et al. | 438/149 |
| 2006/0145264 A1 | 7/2006 | Chidambarrao et al. | |
| 2006/0151832 A1 | 7/2006 | Murthy et al. | |
| 2006/0269692 A1* | 11/2006 | Balseanu et al. | 427/569 |
| 2006/0269693 A1 | 11/2006 | Balseanu et al. | |
| 2007/0065578 A1* | 3/2007 | McDougall | 427/248.1 |
| 2007/0132054 A1 | 6/2007 | Arghavani et al. | |
| 2008/0017862 A1* | 1/2008 | Lee et al. | 257/59 |
| 2008/0020591 A1 | 1/2008 | Balseanu et al. | |
| 2008/0032499 A1* | 2/2008 | Kong et al. | 438/637 |
| 2008/0254203 A1* | 10/2008 | Zhou et al. | 427/74 |
| 2009/0130846 A1* | 5/2009 | Mistuhashi | 438/667 |
| 2009/0160061 A1* | 6/2009 | Hsu et al. | 257/763 |

FOREIGN PATENT DOCUMENTS

| | | |
|---|---|---|
| WO | WO-94/14189 | 6/1994 |
| WO | WO-00/03425 | 1/2000 |
| WO | WO-2005059200 | 6/2005 |
| WO | WO-2005074017 | 8/2005 |

OTHER PUBLICATIONS

Domansky, Karel, et al., "Effect of thermal treatment of passivation integrity of chemical vapor deposition silicon nitride." Appl. Phys. Lett., vol. 60, No. 17, Apr. 27, 1992, pp. 2074-2076.*

Sheikholeslami, Alireza, et al., "Planarization of Silicon Dioxide and Silicon Nitride Passivation Layers". Journal of Physics: Conference Series 61 (2007) 1051-1055.*

PCT Search Report for Application No. PCT/US2011/028531, KIPO Korea, Nov. 28, 2011.

Arghavani, R., et al., "A Reliable and Manufacturable Method to Break the PMOS 1mA/.mu.ml.sub.DSAT Barrier in High Volume Manufacturing", White Paper, undated, pp. 1-7.

Chidambaram, P.R., et al., "35% Drive Current Improvement from Recessed-SiGe Drain Extensions on 37 nm Gate Length PMOS", 2004 Symp. On VLSI Tech. Digest of Tech. Papers. pp. 48-49.

Cianci, et al., "Analysis of Stress and Composition of Silicon Nitride Thin Films Deposited by Electron Cyclotron Resonance Plasma-Enhanced Chemical Vapor Deposition for Microfabrication Processes", Vacuum Sci. & Tech., 23:1, Jan. 6, 2005, pp. 167-172.

Classen, W.A.P., "Ion Bombardment-Induced Mechanical Stress in Plasma-Enhanced Deposited Silicon Nitride and Silicon Oxynitride Films", Plasma Chemistry and Plasma Processing, vol. 7, No. 1, 1987.

Ge, C.H., et al., "Process-Strained Si (PSS) CMOS Technology Featuring 3D Strain Engineering", IEDM—IEEE, 2003, pp. 3.7.1-3.7.4.

Inaba, et al.; "Increase of Parasitic Resistance of Shallow p+ Extension with SiN Sidewall Process by Hydrogen Passivation and its Improvement by Preamorphization for Sub-0.25-micron pMOSFET's" Symposium on VLSI Technology Digest Technical Papers 1996.

Inaba, et al.; Increase of Parasitic Resistance of Shallow p+ Extension by SiN Sidewall Process and Its Improvement by Ge Preamorphization for Sub-0.25 micron pMOSFET's IEEE Transactions on Electron Devices, vol. 46, No. 6, Jun. 1999.

Johnson et al, Characterization of LPCVD of Silicon Nitride in a Rapid Thermal Processor, Mat. Res. Soc. Syp. Proc. 146:345-350 (1989), Raleigh, NC.

Phillips B. J., et al. "Coherent Raman Spectroscopic Monitoring of Pulsed Radio Frequency PECVD of Silicon Nitride Thin Films", Applied Spectroscopy, vol. 55, No. 7, 2001.

Rim, K., et al., "Fabrication and Analysis of Deep Submicron Strained-Si N-MOSFET's", IEEE Trans. On Electron Devices, 47:7, Jul. 2000, pp. 1406-1415.

Tanaka, et al.; "Realization of High Performance Dual Gate DRAMs," Symposium on VLSI Technology Digest Technical Papers 2001.

Tarraf, A., et al., "Stress Investigation of PECVD Dielectric Layers for Advanced Optical MEMS"., J. of Micromech. & Microeng., 14:3, Mar. 1, 2004, pp. 317-323.

Thompson, S.E., et al., "A Logic Nanotechnology Featuring Strained-Silicon", IEEE Electron Device Letters, 25:4, Apr. 2004, pp. 191-193.

Zambom, et al. "Silicon Nitride Deposited by Inductively Coupled Plasma Using Dichlorosilane and Ammonia", Vacuum, vol. 71, p. 439-444, 2003.

* cited by examiner

SILICON NITRIDE PASSIVATION LAYER FOR COVERING HIGH ASPECT RATIO FEATURES

BACKGROUND

Embodiments of the present invention relate to the formation of a passivation layer comprising silicon nitride on high aspect ratio features used to fabricate electronic circuits on substrates.

Electronic circuits, such as integrated, display, memory, power, and photovoltaic circuits, are becoming ever denser and more complex. The dimensions of the features of these circuits are becoming smaller to allow greater aerial densities across the substrate. These features include connector bumps, interconnects, semiconducting or oxide features, gates, electrodes, resistors, vias and many others. The aspect ratio of such features increases as the width or horizontal dimension of the features becomes smaller because the vertical dimension of the features has to be larger to provide the same cross-sectional area. The aspect ratio, which is the ratio of the height to the width of the feature, is a particular problem when the features are covered by a passivation layer to protect or electrically isolate the features.

As an example, a passivation layer 10 can be used to cover features 12, as shown in FIGS. 1A and 1B, to prevent oxidation of the metal-containing surface of the features 12 before or during coating of the features with other materials. The features 12 include interconnects 13 (FIG. 1A) and connector bumps 14 (FIG. 1B). Interconnects 13 are used to connect the active and passive devices on a substrate 15. Connector bumps 14 are used, for example, in flip chip packaging to serve as interconnection points between an integrated circuit chip and the external environment. The connector bumps 14 are formed on bonding pads to allow the die to be "flipped" circuit-upside-down and directly soldered to a connector or circuit board, thereby saving the time and expense of conventional wire bonds and foil connectors. Both the interconnects 13 and connector bumps 14 are covered by a passivation layer 10.

However, as the aspect ratio of the interconnects 13 or connector bumps 14 increases to values above 0.2, it becomes increasingly difficult to deposit a continuous, conformal, and substantially defect-free passivation layer 10 around the features 12, especially the re-entrant corners 17 of the features. Referring to FIG. 1A, the passivation layer 10 forms defects 11, such as the seams 16, which split open the passivation layer 10 at the corners 17 of the interconnects 13. The passivation layer 10 on the connector bumps 14 can also form seams 16 at the corners 17 around the base of the connector bumps 14.

The seam problem is often aggravated by the geometrical elements of the re-entrant corners 17 in chip packaging, redistribution layers (RDL), or through-silicon-via (TSV) copper or tungsten vias. For example, high aspect ratio features 12 such as silicon vias 18, as shown in FIG. 1C, comprise apertures formed through a dielectric layer 19, which are filled with an electrical conductive material to form a connection between an underlying feature such as an interconnect 13 and overlying feature such as a connector bump 14. When the silicon via 18 and overlying connector bump 14 are coated with a passivation layer 10, seams 16 often occur at the re-entrant corners 17 formed at the intersection of the passivation layer 10 with the connector bump 14 and the silicon via 18. Still another example of high aspect ratio features 12 comprises oxide structures (not shown) covered with a passivation layer 10. Oxide structures can include silicon dioxide containing structures, such as oxide liner layers formed in through-silicon vias, or oxide layers formed on top of the copper pillars of through-silicon-vias which allow revealing the via connection at the backside of the substrate. Again, defects 11 form in the passivation layer 10 covering such features 12.

The defects 11 within the passivation layers 10 at regions of the features 12 which have a complex geometry, especially with re-entrant corners 17 that have sharp edges and angles, can also be of other types such as micro-cracks, hairline cracks, and still others. However, it is not apparent how to form features 12 with these high aspect ratios and maintain the geometry and other dimensions of these features, while still preventing defects from occurring in such passivation layers 10.

Thus, for various reasons that include these and other deficiencies, and despite the development of various methods of depositing passivation layers around features, further improvements in the deposition of passivation layers are continuously being sought.

SUMMARY

A method of forming a passivation layer comprising a silicon nitride layer, on features of a substrate, comprises providing a substrate having a plurality of features in a process zone. In a first stage, a dielectric deposition gas comprising a silicon-containing gas and a nitrogen-containing gas, is introduced into the process zone, and energized to deposit a silicon nitride layer on the features. In a second stage, treatment gas having a different composition that the dielectric deposition gas, is introduced into the process zone, and energized to treat the silicon nitride layer. The first and second stages are performed a plurality of times.

The method can include an initial cleaning stage comprising providing a cleaning gas comprising a hydrogen-containing gas into the process zone, and energizing the cleaning gas to form an energized cleaning gas comprising hydrogen-containing species which cleans off a native oxide film on the features of the substrate.

In still another version, an initial soaking stage comprises providing a soaking gas comprising silane into the process zone, and maintaining the substrate at a temperature of from about 100 to about 240° C. to deposit an adhesion layer on the features of the substrate.

In yet another version, the method comprises depositing on the features, a conformal liner having a thickness greater than approximately 100Å, and a tensile stress of at least about 100 MPa. The conformal liner can be deposited by: (1) introducing into the process zone, a liner gas comprising (i) $SiH_4$, $NH_3$ and $N_2$; (ii) trisilyamine, $NH_3$, and $N_2$; (iii) $SiH_4$ or $N_2$; or (iv) trisilyamine or $N_2$ chemistry; and (2) energizing the liner gas to form a plasma.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

Figure 6:
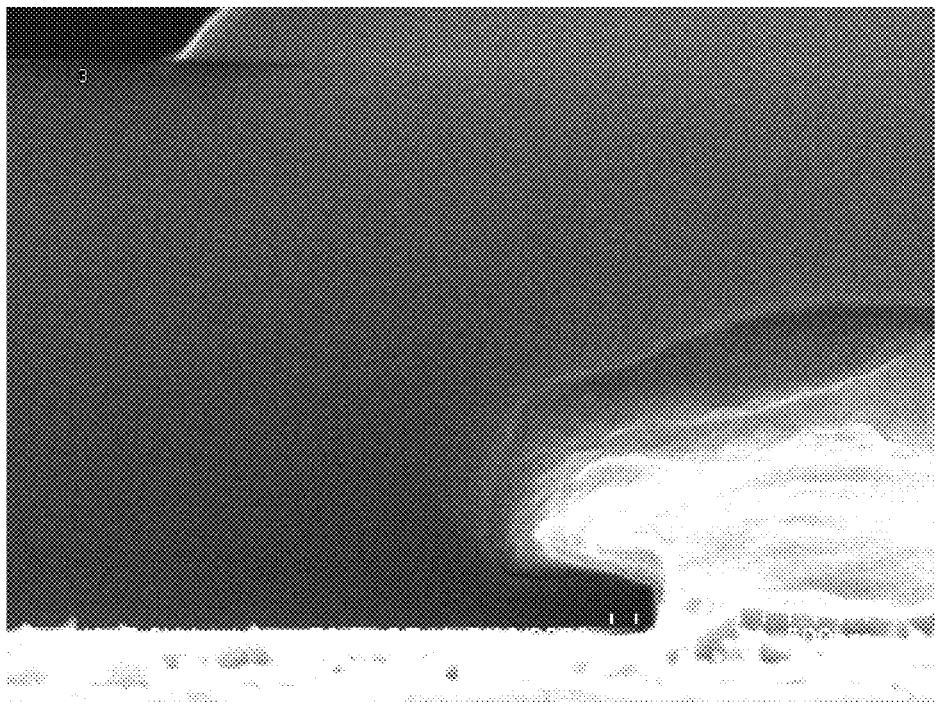
Figure 7:
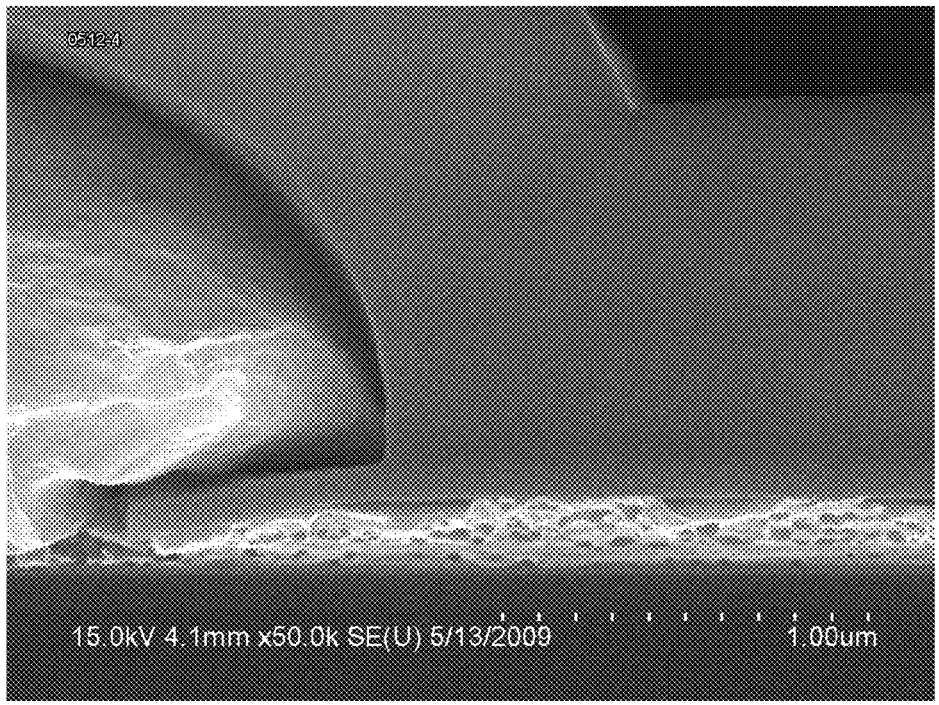

FIG. 6 is a scanning electron micrograph showing the lack of seams along the corner of the passivation layer of silicon nitride having a relatively high refractive index; and FIG. 7 is a scanning electron micrograph of a high aspect ratio feature comprising a passivation layer of silicon nitride deposited over a thin conformal liner showing the absence of seams or cracks at the corners of the passivation layer.

DESCRIPTION

Figure 1A:
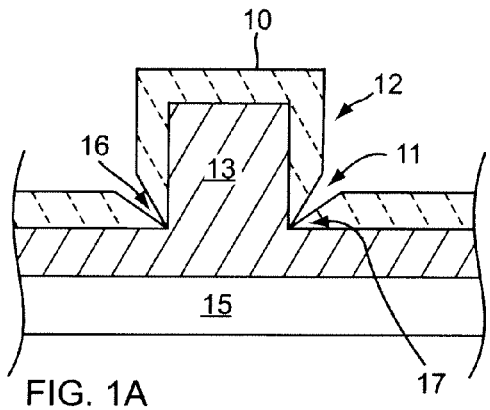
FIG. 1A (Prior Art) is a schematic cross-sectional view of a substrate showing the seams at the corners of a passivation layer covering a high aspect ratio feature that is an interconnect.
Figure 1B:
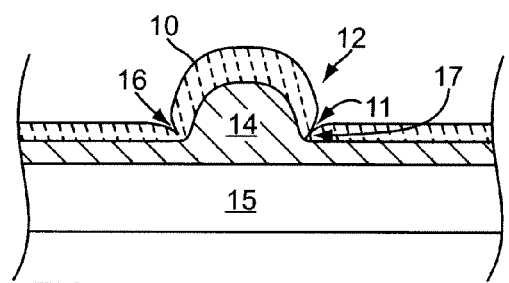
FIG. 1B (Prior Art) is a schematic cross-sectional view of a connector bump on a substrate with the seams at the corners of an overlying passivation layer.
Figure 1C:
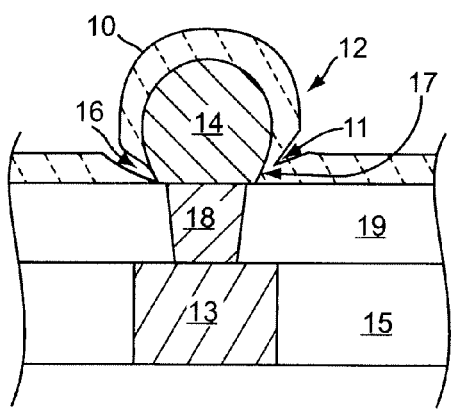
FIG. 1C (Prior Art) is a schematic cross-sectional view of a substrate having a high aspect ratio feature comprising a via and showing the seams at the corners of the passivation layer.
Figure 2A:
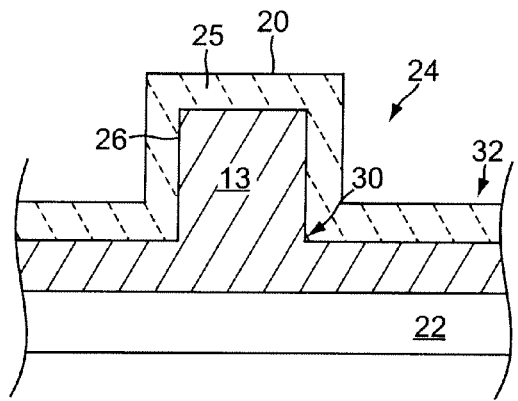
FIG. 2A is a schematic cross-sectional view of a high aspect ratio feature comprising an interconnect on a substrate and showing a passivation layer that provides a conformal coating without seams at the bottom re-entrant corners of the interconnect.
Figure 2B:
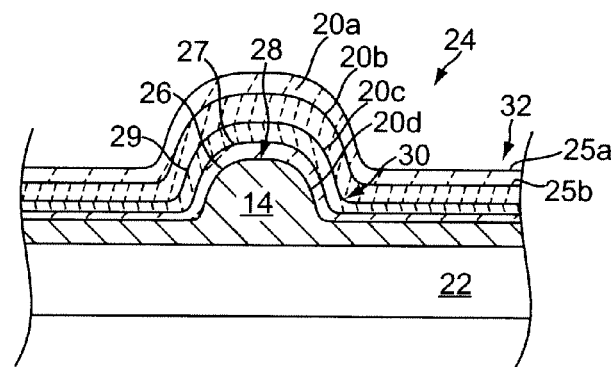
FIG. 2B is a schematic cross-sectional view of a connector bump on a substrate showing a conformal passivation layer having uniform deposition deposited over the connector bump.
Figure 2C:
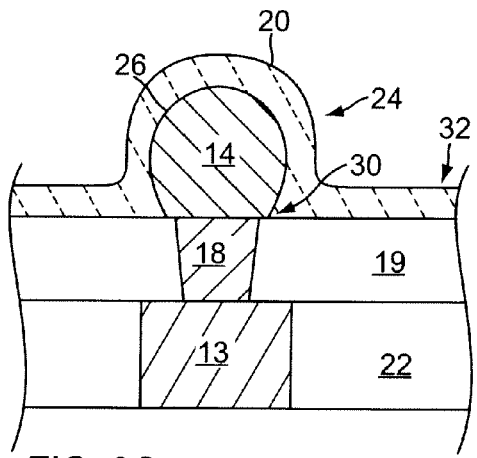
FIG. 2C is a schematic cross-sectional view of a via and overlying connector bump showing deposition of a uniform passivation layer over the connector bump and via.

A passivation layer 20 can be deposited on a substrate 22 using the deposition and treatment processes to form a continuous, conformal, and substantially defect-free coating on features 24 of the substrate 22, as shown in FIGS. 2A to 2C. The substrate 22 can be, for example, a semiconductor wafer, compound semiconductor, or dielectric. A semiconductor wafer comprises single or a few large crystals of silicon, germanium, or silicon germanium. An exemplary compound semiconductor comprises gallium arsenide. A suitable dielectric comprises a glass panel or display and can include borophosphosilicate glass, phosphosilicate glass, borosilicate glass, and phosphosilicate glass, among other materials.

The passivation layer 20 can be a single layer as shown in FIG. 2A or a plurality of layers 20a-d as shown in FIG. 2B. For example, the passivation layer 20 can be a single dielectric layer 25, or a plurality of layers 20a,b that each comprise a dielectric layer 25a,b. The passivation layer 20 is provided to passivate the exposed surfaces of the underlying materials of the features 24 by reducing the reaction rates of these materials with the external environment. For example, a passivation layer 20 deposited over features comprising a metal-containing material, or even consisting of a metal-containing material, can reduce the formation of native oxide films on the metal-containing surfaces of the features. The dielectric layer can be, for example, silicon nitride ($Si_3N_4$), silicon dioxide ($SiO_2$), or other such materials. Typically, the dielectric layer is deposited in a thickness of less than 1000 angstroms, or even 500 angstroms.

The passivation layer 20 can also include other layers 20c such as an adhesion layer 27 which is deposited below the dielectric layer 25 to adhere the dielectric layer 25 to the exposed surfaces 28 of the features 24. The adhesion layer 27 can be composed of the same material as the dielectric layer 25, the variant of the dielectric material, or a different material. For example, when the dielectric layer 25 comprises a silicon nitride layer, the adhesion layer 27 can be a silicon-rich silicon nitride layer.

The passivation layer 20 can further include another component layer 20d, such as a conformal liner 29 which is formed below the dielectric layer 25. The conformal liner 29 can be deposited over the adhesion layer 27. The conformal liner 29 serves to promote adhesion and step coverage. A suitable conformal liner 29 comprises of $Si_3N_4$ film made from $SiH_4$ or TSA as silicon precursors.

The entire passivation layer 20 is deposited on features 24 which are already formed on the substrate 22 using other conventional processes. The features 24 can have different shapes and a cross-sectional profile that extends outward from the flat plane of the substrate 22. For example, the features 24 can include interconnects 13, connector bumps 14, silicon vias 18, oxide structures, or combinations of these or other shapes and structures, some examples being provided in FIGS. 2A to 2C. The passivation layer 20 provides conformal coverage of the underlying features 24, even for high aspect ratio features 26 which have a ratio of height to width of greater than 0.2, or even greater than 5, or even greater than 10. For example, the passivation layer 20 can be deposited to cover features 24 comprising metal-containing material, such as the interconnect 13 of FIG. 2A, connector bump 14 of FIG. 2B, or connector bump 14 and via 18 in dielectric layer 19 of FIG. 2C. In this application, the passivation layer 20 prevents or reduces oxidation of the metal-containing surface of these features 24.

Figure 3:
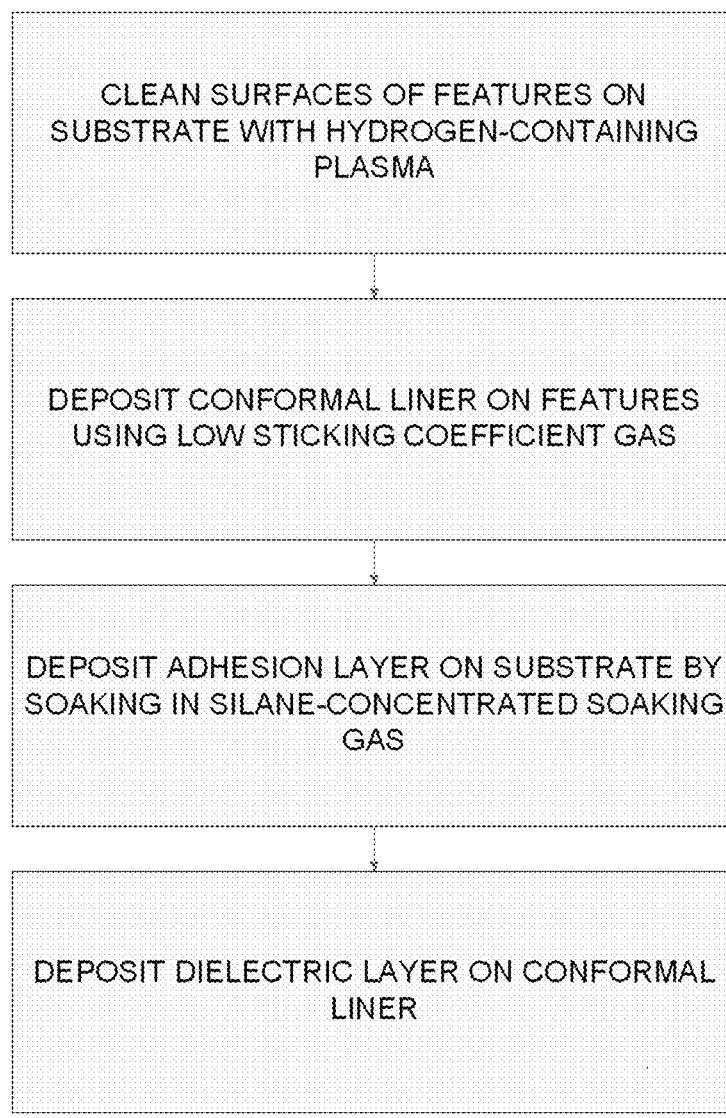
FIG. 3 is a flowchart of an exemplary version of a process for depositing a passivating layer having sub-layers on features of a substrate.
Figure 4:
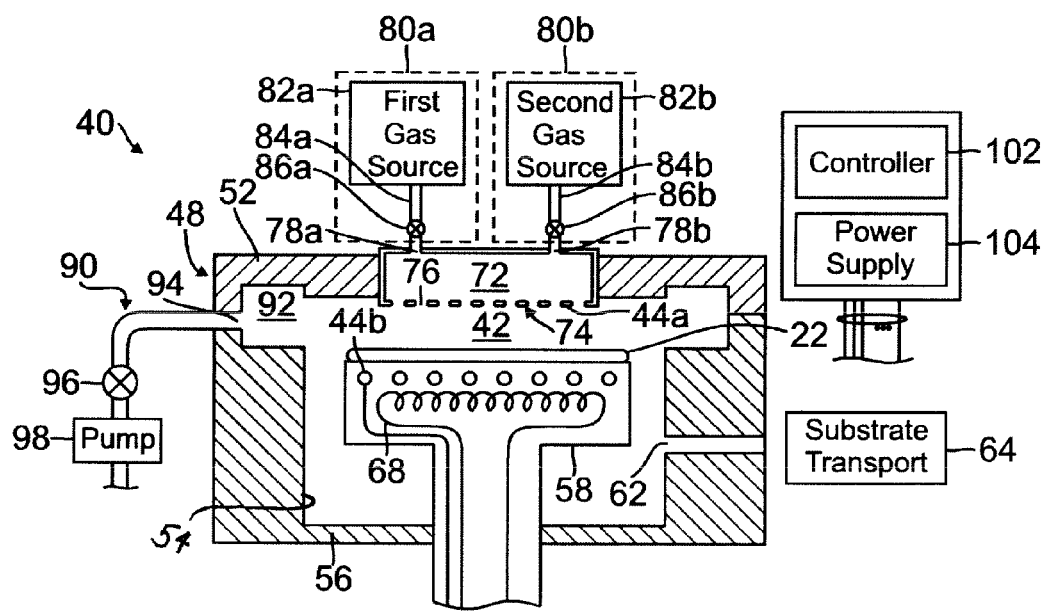
FIG. 4 is a schematic view of an embodiment of a substrate processing chamber suitable for forming and treating the passivation layer, performing initial cleaning and soaking processes, and depositing a stressed conformal liner, on a substrate.

Fabrication of the passivation layer 20 will now be described with reference to exemplary processes and an exemplary process chamber for processing a substrate 22. An exemplary process with optional steps is shown in the flow chart of FIG. 3. Any of the processes described herein can be performed by placing a substrate 22 in a process zone 42 of a process chamber 40, an exemplary version of a suitable chamber being shown in FIG. 4. While exemplary versions of processes and process chamber 40 are illustrated in FIGS. 3 and 4, it should be understood that other processes can be used, and these processes may be performed in other process chambers as would be apparent to those of ordinary skill in the art. Thus, the exemplary versions of the process and chamber illustrated herein should not be used to limit the scope of the present claims.

Prior to depositing a passivation layer 20 on the substrate 22, optionally, it may be desirable to perform an initial cleaning stage to clean the exposed surfaces of the features 24, especially those comprising a metal-containing material as shown in the flow chart of FIG. 3. When the features 24 are made of a metal or metal-containing material, such as an electrical interconnect 13 or connector bump 14, the exposed surface of the features 24 becomes oxidized to form a native oxide film. The cleaning process removes native oxide film or other process deposits formed on the surface of the features 24 from exposure to an oxygen-containing environment. The cleaning process can clean the surface of a feature 24 comprising metal-containing material, e.g., aluminum, copper, titanium, tungsten, or alloys and compounds thereof, or other materials.

In one version of the cleaning process, a cleaning gas comprising a hydrogen-containing gas is used to remove a native oxide formed on the surface of the features 24. The cleaning process exposes the substrate 22 to an energized cleaning gas comprising hydrogen-containing plasma species which is formed by coupling energy to a suitable hydrogen-containing gas, such as for $H_2$, or $N_2$ and $NH_3$, or $H_2O$, or $SiH_4$. A suitable volumetric flow rate of the hydrogen-containing gas is from about 100 sccm to about 18 liters/minute. It is believed that the hydrogen-containing plasma species chemically react with the oxygen-component of the native oxide film formed on the features 24 to form volatile hydroxyl species or water vapor that can be exhausted, thereby removing the native oxide film from the surface of the feature 24. Thus, the energized hydrogen-containing radicals interact specifically with the native oxide films on the feature 24 and do not undesirably damage the structure of the surrounding layers.

An exemplary cleaning gas composition comprises, or essentially consists of, $H_2$ in a volumetric flow rate of from about 500 to about 3000 sccm (e.g., about 1000 sccm). In another example, the cleaning gas comprises a mixture of $NH_3$ in a volumetric flow rate of from about 50 to about 300 sccm (e.g., about 160 sccm), and $N_2$ in a volumetric flow rate of from about 1000 L/min to 30,000 L/min (e.g., about 18,000 L/min). In still another example, the cleaning gas comprises a mixture of $H_2$ in a volumetric flow rate of from about 500 to about 3000 sccm (e.g., about 1000 of sccm), and $NH_3$ in a volumetric flow rate of from about 50 to about 300 sccm (e.g., about 160 sccm). In these examples, the substrate 22 is placed in the process zone 42, and the cleaning gas composition is introduced into the chamber 40 and maintained at a pressure ranging from about 1.5 to about 8.0 Torr, or even 9.0 Torr. A plasma is then formed from the cleaning gas by coupling RF energy to process electrodes 44a,b about the process zone 42, at a power level of from about 50 to about 700 Watts (e.g., 150 Watts). The process electrodes 44 can be maintained at a spacing of from about 50 mm (200 mils) to about 150 mm (600 mils). The temperature of the substrate 10 is maintained at from about 180 to about 550° C., such as 400° C.

After the cleaning process, an optional initial soaking stage can be performed to deposit an adhesion layer 27 over the features 24. This adhesion layer, when deposited, forms a portion of the final passivation layer 20. In one version of this process, the features 24 on a substrate 22 are exposed to a soaking gas comprising silane to deposit an adhesion layer comprising, for example, a thin layer of silicon-rich silicon nitride. The thin silicon-rich silicon nitride layer comprises a thickness of from about 10 A to about 100A.

In an exemplary soaking process, a substrate 22 is transferred into a process zone 42 and maintained at a temperature of from about 100° C. to about 240° C., e.g., about 180° C. A soaking gas comprising silane, ammonia, and nitrogen is then introduced into the process zone 42, and the substrate 22 is allowed to soak in the silicon-rich gas environment at temperature. A suitable composition of soaking gas comprises: silane in a volumetric flow rate of from about 200 to about 800 sccm (e.g., about 500 sccm); ammonia in a flow rate of from about 200 to about 800 sccm (e.g., about 450 sccm); and nitrogen in a flow rate of from about 4000 to about 12,000 sccm (e.g., about 8000 sccm). The soaking gas is maintained at a pressure of from about 1 to about 5 Torr (e.g., 2.2 Torr). The soaking process can be carried out for about 5 to 30 seconds (e.g., about 10 seconds). During the soaking process, RF energy is not applied to the electrodes 44a,b; instead, the substrate 22 is allowed to soak at temperature in the soaking gas to form a thin layer of silicon-rich silicon nitride. The soaking process is particularly applicable when the features 24 comprise connector bumps 14 composed of copper.

In an optional lining process, a conformal liner 29 is deposited directly over the features 24 or over the adhesion layer formed in the soaking process. The conformal liner 29 also forms a portion of the passivation layer 20 and allows the overlying layers to deposit to the profile of the features 24 with greater conformability. In one version, the conformal liner 29 comprises an intrinsic tensile stress of at least about 100 MPa, as measured by a film thickness and stress measurement tool which uses spectroscopic ellipsometry or single wavelength ellipsometry, such as a KLA-Tencor FX-100, from KLA-Tencor, San Jose, Calif. It is believed that the conformal liner 29 reduces defects 11 by reducing the stress gradient at the interface between the exposed surfaces of the features 24 and the overlying passivation layer 20. The conformal liner 29 results from the formation of plasma species which have a low sticking coefficient of less than 0.14, such as triaminosilane. The low sticking coefficient species reduce the surface energy at the exposed surface of the features 24, allowing the conformal liner 29 to cover the re-entrant profile at the bottom corners 30 of the features 24, and thus, avoid the high-stress concentrations at these bottom corners 30 that result in seams. In one version, the conformal liner 29 is a thin layer, having, for example, a thickness of less than about 100 angstroms. The conformal liner 29 can be deposited by introducing into the process zone 42, a liner gas comprising silicon-containing gas and nitrogen-containing gas, and energizing the liner gas with a plasma, in any of the aforementioned process conditions, such as flow rate, pressure, plasma power, and others. A suitable composition of liner gas comprises a silicon-containing gas comprising silane, and a nitrogen-containing gas comprising a mixture of ammonia and nitrogen. In another version, another composition of the liner gas comprises a silicon-containing gas comprising trisilyamine (TSA), and a nitrogen-containing gas comprising nitrogen, or a mixture of ammonia and nitrogen. In still another version, the liner gas comprises only a silicon-containing gas such as silane or trisilyamine, or only a nitrogen-containing gas such as nitrogen. In each case, the liner gas is energized by a plasma formed by RF power applied to the parallel plate reactor such as a PECVD chamber.

After the optional cleaning and lining processes, the dielectric layer 25 of the passivation layer 20 is deposited to conformally cover the features 24. The deposition processes allow deposition of a dielectric layer 25 that is uniform and continuous, and substantially absent defects 11, at the bottom corners 30 of features 24 such as the high aspect ratio features 26.

In one version, a passivation layer 20 comprising a silicon nitride layer is deposited on the substrate 22. In this process, the substrate 22 is placed in the process zone 42 of the chamber 40 and heated to a relatively low temperature during the deposition process. The low deposition temperature is important to depositing a passivation layer 20 that is conformal to the shape of the features 24, especially the high aspect ratio features 26. By conformal it is meant that the passivation layer 20 follows the profile of the underlying features 24 with a relatively uniform thickness over the entire exposed surfaces of the features 24 as well as the spacing 32 between the features 24. In one version, during the dielectric deposition process, the substrate 22 is heated to a temperature of from about 180° C. to about 550° C., or even from about 160° C. to about 420° C. These temperatures are much lower than prior art temperatures which typically exceeded 600° C. or even 700° C.

In a first deposition stage, a dielectric deposition gas, comprising a silicon-containing gas and a nitrogen-containing gas, is introduced into the process zone 42. The silicon-containing gas is a gas comprising silicon, which can be a silicon-containing compound which is provided in the flow of gas or vapor. The silicon-containing gases can be silane, disilane, trimethylsilyl (TMS), tris(dimethylamino)silane (TDMAS), bis(tertiary-butylamino)silane (BTBAS), dichlorosilane (DCS), or mixtures thereof. In one version, the silicon-containing gas comprises silane ($SiH_4$). A suitable silane flow rate is from about 50 to about 2000 sccm, or from about 400 to about 1000 sccm. The nitrogen-containing gas, can be ammonia ($NH_3$), nitrogen ($N_2$), or mixtures thereof. In one version, the nitrogen-containing gas comprises a mixture of ammonia and nitrogen. A suitable flow rate for ammonia is from about 100 to about 1000 sccm, or even from about 400 to about 800 sccm. The nitrogen gas serves not just as a source of nitrogen atoms but also as a diluent gas to control the energy and nature of the plasma formed in the process zone 42. The diluent gas is added in a relatively large volume compared to the silicon-containing gas or nitrogen-containing gas. The diluent gas serves to control the ratio of energized species to reactive species in the plasma and can also be used to dissociate additional species within the plasma by transferring energy to through a larger number of collisions between the large number of diluent gas molecules compared to the number of reactive gaseous molecules. In one example, the diluent gas can be nitrogen. Nitrogen can serve as both a source of nitrogen-containing gaseous species in the deposition of silicon nitride and a source of energized molecules to generate and sustain a plasma. A suitable flow rate for nitrogen is from about 5000 to about 25,000 sccm (e.g., from about 8000 to about 12,000 sccm).

In one embodiment, the dielectric deposition gas comprises a mixture of silane, ammonia, and nitrogen. Advantageously, such a composition of dielectric deposition gas provides higher nitrogen to silicon ratios in the deposited layer, which gives higher refractive indexes of from about 1.8 to about 2.0, or even from about 1.88 to about 1.98. In a preferred version, the dielectric deposition gas comprises a mixture of silane, ammonia, and nitrogen in a volumetric ratio of $SiH_4:NH_3:N_2$ is from about 1:1:8 to about 2:1:20. In these ratios, the dielectric deposition gas was found to provide more conformal coverage because of higher amine species in the plasma which results lower sticking coefficients. The dielectric deposition gas is energized in the process zone 42 or in a remote zone (not shown) to activate the process gas species to deposit material on the substrate 22. In one version, the dielectric deposition gas is energized to form a plasma in the process zone 42 by coupling RF energy to process electrodes 44,b which are about the process zone 42. To generate the plasma, the electrode power level is typically maintained at from about 500 to about 1600 Watts, or even from about 800 to about 1500 Watts. A suitable electrode spacing is from about 5 mm (200 mils) to about 20 mm (800 mils).

The present deposition process allows deposition at temperatures that are lower by at least about 100° C. compared to conventional processes by controlling the pressure of the dielectric deposition gas introduced into the process zone 42. A low pressure of deposition gas is desirable to increase the concentration of particular species in the deposited passivation layer 20—for example, to increase the concentration of nitrogen in a passivation layer 20 comprising silicon nitride. Further, increasing the ion bombardment component at low deposition pressures produces a denser passivation layer 20. A suitable pressure of the dielectric deposition gas is from about 1.5 Torr to about 6 Torr, or even from about 2 to about 4 Torr.

In one example of a dielectric deposition stage, a dielectric layer 25 consisting of silicon nitride was deposited over features 24 such as connector bumps on a flip chip substrate. The connector bumps were high aspect ratio features 26 with aspect ratios of from about 0.2 to about 10. In the deposition process, the substrate 22 was maintained at a temperature of 180° C. A dielectric deposition gas, comprising silane in a flow rate of 820 sccm, ammonia in a flow rate of 590 sccm, and nitrogen in a flow rate of 10 L/min, was introduced into the process zone 42. The dielectric deposition gas was maintained at a pressure of 3.5 Torr. RF power was applied at a power level of 1000 to the process electrodes 44a,b maintained at a spacing of 11 mm (450 mils).

In another example of a dielectric deposition stage, a dielectric layer 25 comprising silicon nitride was deposited over features 24 which were connector bumps. In the deposition process, the substrate 22 was maintained at a temperature of 400° C., and the dielectric deposition gas was maintained at a pressure of 4.2 Torr. The remaining conditions for the same as in Example 1. The deposited passivation layer 20, comprising silicon nitride, can have a thickness of less than 1000 angstroms, or even 500 angstroms. Advantageously, the thin silicon layers provide more conformal coverage of the underlying features 24 comprising high aspect ratio features 26.

After the deposition of a dielectric layer 25 of silicon nitride, the deposited passivation layer 20 is further treated in a plasma treatment stage. In this treatment stage, a treatment gas is introduced into the process zone 42. The treatment gas can be a non-reactive gas, such as an inert gas. Suitable inert gases include helium or argon. A suitable flow rate for such or other inert gases is from about 2,000 sccm to about 20,000 sccm. For example, suitable non-reactive gases include nitrogen-containing gases, such as ammonia, nitrogen, or mixtures thereof. In one version, the non-reactive gas comprises ammonia or nitrogen, or mixtures thereof. A suitable fluid for the non-reacting gas is from about 2,000 sccm to about 20,000 sccm. For example, a treatment gas comprising ammonia and nitrogen in a flow rate of from about 5,000sccm to about 15,000 sccm can be introduced into the chamber 40 and maintained at a pressure of 3.5 Torr. The preselected treatment gas is energized to form a plasma to treat the deposited silicon nitride layer by coupling energy between the process electrodes 44a,b in the process chamber 40. The process electrodes 44a,b can be energized by coupling RF energy to the electrodes at a power level of from about 75 to about 1,600 watts. It is believed that in the treatment process, hydrogen atoms are driven out from the deposited passivation layer 20. The presence of hydrogen in the deposited layer 20 is undesirable because of moisture. Accordingly, removing the hydrogen by treating the deposited passivation layer 20 and treatment gas comprising nitrogen-containing gas serves to densify the film.

The deposition and treatment processes are performed in multiple cycles to enhance the resilience of the deposited passivation layer 20 to defect formation, especially when the dielectric layer 25 is deposited on high aspect ratio features 26. In the multi-cycle process, the deposition and treatment stages are each performed a plurality of times. The multiple cycle process enhances the ability of the deposited passivation layer 20 to resist formation of defects such as seams, at the bottom corners 30 of the high aspect ratio features 26. In the multi-cycle process, the flow of dielectric deposition gas into the process zone 42 is stopped or altered, and the flow of treatment gas is commenced or initiated by altering the composition of the dielectric deposition gas to achieve the composition of the treatment gas. For example, the treatment gas can comprise a nitrogen-containing gas, such as the aforementioned ammonia and nitrogen, or mixtures thereof, and which is absent the silicon-containing gas. The treatment stage is performed by simply stopping the flow of the silicon-containing gas of the dielectric deposition gas while continuing the flow of the nitrogen-containing gas to convert the dielectric deposition gas to the treatment gas, stopping the flow of silane while continuing the flow of ammonia and nitrogen, and energizing the ammonia and nitrogen to form a plasma. This version is advantageously used for densifying the film.

It was also discovered that the refractive index (n) of the deposited passivation layer 20 (such as that of the silicon nitride layer) affected the level of defects 11 in the deposited layer at the bottom corners 30 and other geometrical transition regions of the features, especially the high aspect ratio features 26. It is believed that the refractive index is an inverse measure of the amount of nitrogen in the deposited passivation layer 20. A nitrogen-rich passivation layer 20 provides lower Si—H content, which in turn provides stable film, It was further determined that a desirable passivation layer 20 comprising silicon nitride has a refractive index of higher than 1.88, or even 1.92. In one example, the refractive index was measured using ellipsometry at a wavelength of 633 nm, using the previously described KLA-Tencor film measurement apparatus Thus, in one version, the process conditions can also be set to deposit a silicon nitride layer having a refractive index (n) that is less than 1.88 as measured using ellipsometry at a wavelength of 633 nm.

In a first example of the refractive index control process, suitable process conditions to obtain a desirable refractive index that is less than 1.88 were as follows: (1) a substrate temperature of 180° C., (2) a gas composition comprising silane in a flow rate of 820 sccm, ammonia in a flow rate of 590 sccm, and nitrogen in a flow rate of 8000 sccm, (3) a chamber gas pressure of 2.2 Torr, and (4) an electrode power level of 1080 Watts and an electrode spacing of 640 mils (16.3 mm). In a second example, all the process conditions were the same as the first example, except that the flow rate of silane was maintained at 820 sccm and that of ammonia was 590 sccm.

It was also discovered that the wet etch rate ratio WERR of the deposited passivation layer 20 of silicon nitride relative to the wet etch rate of etching thermal oxide affected the level of defects 11 in the deposited layer. Thermal oxide is silicon dioxide deposited by a thermal process, for example, grown in a vertical or horizontal diffusion furnace or in a Rapid Thermal Processor at high temperatures from 800° C. to 1200° C. The WERR was determined to be 0.3 to about 5.2. This affected integrity at the bottom corners 30 and other geometrical transition regions of the features, especially the high aspect ratio features 26. Thus, the deposition process conditions were set to deposit a silicon nitride layer having a wet etch rate ratio WERR of etching the passivation layer 20 relative to thermal oxide which is less than 5.2.

In still another method, the number of defects 11 in a passivation layer 20 deposited over features 24, such as the high aspect ratio features 26, is reduced by depositing a passivation layer 20 having a stress gradient through the thickness of the layer. For example, a passivation layer 20 comprising silicon nitride having a stress gradient can be deposited by controlling the flow rate of one or more gases during the deposition process. In this version, the deposited passivation layer 20 comprises silicon nitride having gradual changes, or step-wise changes, in the ratio of silicon to nitrogen in the layer. The passivation layer 20 comprises at least a first and second ratio of silicon to nitrogen through the thickness of the layer 20. This is done by changing the composition of the dielectric deposition gas to have a first gas change from a high flow rate to a low flow rate during the deposition process. For example, silicon nitride can be deposited using a process gas comprising a silicon-containing gas component comprising silane ($SiH_4$), a nitrogen-gas component comprising ammonia ($NH_3$), and a diluent gas component comprising nitrogen ($N_2$). Initially, a dielectric deposition gas comprising a first ratio of silicon-containing component to nitrogen-containing component is used, and a plasma of the process gas is generated in the process zone. Thereafter, a treatment gas comprising a second ratio of silicon-containing component to nitrogen-containing component is used, and a plasma of the process gas is generated in the process zone. The first ratio of silicon-containing component to nitrogen-containing component is less than about 100:1, and the second ratio of silicon-containing component to nitrogen-containing component power level is at least about 1. For example, the ratio of silane to ammonia can be changed during the deposition process to go from about 1:1 to about 6:1.

In another version, the passivation layer 20 comprising silicon nitride having a stress gradient can be deposited by controlling the RF power applied to a pair of process electrodes 44a,b about the substrate 22. In this process, a process gas is introduced into the process zone 42, the process gas comprising a silicon-containing component to nitrogen-containing component as described herein. A plasma of the process gas in the process zone 24 is generated by applying energy at a first power level to electrodes about the process zone 42. Thereafter, silicon nitride having a second ratio of silicon to nitrogen is deposited by changing the energy applied to electrodes 44a, b to a second power level. In one version, the first power level is a least about 100 Watts higher than the second power level. For example, the first power level can comprise less than about 200 Watts, and the second power level comprises at least about 500 Watts. In this process, the ratio of silicon to nitrogen in the silicon nitride deposited on the substrate 22 affects the stress of the deposited layer.

In another version, the passivation layer 20 comprising silicon nitride comprises a plurality of discrete silicon nitride sub-layers that each has a different stress level to provide a layer having a gradual or stepped increase of stress for each layer. For example, the stress of the passivation layer can be increased from a first stress to a second stress that is at least 100 MPa lower than the first stress. The first stress can be from about 600 to about 1000 MPa, and the second pressure can be from about 500 to about 900 MPa. In one version, the first pressure is 800 MPa and the second pressure is 700 MPa. The change in gas pressure within the process zone 42 changes the density of the plasma formed in the process zone 42. A denser plasma is one which has larger number of gaseous ions and species within a certain volume of confined space. The denser plasma deposits a passivation layer 20 which is denser than the passivation layer 20 deposited from a less dense plasma. The denser passivation layer 20 has a higher stress level, and accordingly, the resultant passivation layer 20 comprises a multilayer structure having different layers with different densities.

In the versions described above, the deposited passivation layer 20 comprises a silicon nitride layer having a compositional gradient in which the ratio of silicon to nitrogen varies through the thickness of the layer. For example, the passivation layer 20 can have a compositional gradient in which the ratio of silicon to nitrogen varies through the thickness by at least about 40%. The silicon nitride layer can also have a compositional gradient in which the ratio of silicon to nitrogen varies through the thickness by from about 0.4 to about 1.5. In still a further version, the passivation layer 20 is layer is deposited by sequentially depositing and etching away a deposited silicon nitride layer. For example, this process can etch away a portion of the deposited layer to change the reentrant profile at the bottom corners 30 of the features 24. In this version, the deposit and simultaneous etching process is performed by placing a substrate 22 in a process zone 42 of a process chamber 40, and after depositing passivation layer 20 to certain thickness, introducing energized etching gases, such as fluorine based chemicals in remote plasma, so the sidewall and bottom of the copper bumps can be etched partially to change the reentrant profile at the bottom corner. The deposition and etching processes are performed in multiple cycles to modify the reentrant profile to a rounded profile at the bottom corner; thus, the passivation layer 20 can be deposited without defects.

An embodiment of a substrate processing chamber 40 which can be used to perform the above described processes is illustrated in FIG. 4. The chamber 40 is provided to illustrate an exemplary chamber; however, other chambers may also be used, as would be apparent to one of ordinary skill in the art. Accordingly, the scope of the invention should not be limited to the exemplary chamber described herein. Generally, the process chamber 40 is a plasma-enhanced chemical vapor deposition (PE-CVD) chamber suitable for processing a substrate 22 (such as a silicon wafer), a suitable chamber being a Producer® SE type chamber from Applied Materials, Santa Clara, Calif. The chamber 40 comprises enclosure walls 48, which include a ceiling 52, sidewalls 54, and a bottom wall 56, that enclose a process zone 42. The chamber 40 may also comprise a liner (not shown) that lines at least a portion of the enclosure walls 48 about the process zone 42. For processing a 300 mm silicon wafer, the chamber 40 typically has a volume of about 20,000 to about 30,000 cm$^3$, and more typically about 24,000 cm$^3$.

During a process cycle, the substrate support 58 is lowered and a substrate 22 is passed through an inlet port 62 and placed on the substrate support 58 by a substrate transport 64, such as a robot arm. The substrate support 58 can be moved between a lower position for loading and unloading and an adjustable upper position for processing of the substrate 22. The substrate support 58 can include an enclosed electrode 44a to generate a plasma from process gas introduced into the chamber 40. The substrate support 58 can be heated by heater 68, which can be an electrically resistive heating element (as shown), a heating lamp (not shown), or the plasma itself. The substrate support 58 typically comprises a ceramic structure which has a receiving surface to receive the substrate 22 and which protects the electrode 44a and heater 68 from the chamber environment. In use, a radio frequency (RF) voltage is applied to the electrode 44a and a direct current (DC) voltage is applied to the heater 68. The electrode 44a in the substrate support 58 can also be used to electrostatically clamp the substrate 22 to the support 58. The substrate support 58 may also comprise one or more rings (not shown) that at least partially surround a periphery of the substrate 22 on the substrate support 58.

After a substrate 22 is loaded onto the substrate support 58, the support 58 is raised to a processing position that is closer to the gas distributor 72 to provide a desired spacing gap distance, d$_s$, therebetween. The spacing distance can be from about 2 mm to about 12 mm. The gas distributor 72 is located above the process zone 42 for dispersing a process gas uniformly across the substrate 22. The gas distributor 72 can separately deliver two independent streams of first and second gases or mixtures of gases that form any of the process gases described herein, or the deposition gas and the treatment gas in separate streams, to the process zone 42 without mixing the gas streams prior to their introduction into the process zone 42. Alternatively, the gas distributor can premix the process gas before providing the premixed process gas to the process zone 42. The gas distributor 72 comprises a faceplate 74 having holes 76 that allow the passage of process gas therethrough. The faceplate 74 is typically made of metal to allow the application of a voltage or potential thereto and thereby serves as electrode 44a in the chamber 40. A suitable faceplate 74 can be made of aluminum with an anodized coating.

The substrate processing chamber 40 also comprises first and second gas supplies 80a,b to deliver the process gas to the gas distributor 72, the gas supplies 80a,b each comprising a gas source 82a,b, one or more gas conduits 84a,b, and one or more gas valves 86a,b. In one version, the first gas supply 80a comprises a first gas conduit 84a and a first gas valve 86a to deliver a dielectric deposition gas from the gas source 82a to a first inlet 78a of the gas distributor 72, and the second gas supply 82b comprises a second gas conduit 84b and a second gas valve 86b to deliver a treatment gas from the second gas source 80b to a second inlet 78b of the gas distributor 72.

The process gas can be energized by coupling electromagnetic energy—for example, high-frequency voltage energy to the process gas to form a plasma from the process gas. To energize the dielectric deposition gas, a voltage is applied between (i) a first electrode 44a, which may be the gas distributor 72, ceiling 52, or chamber sidewall 54, and (ii) the electrode 44b in the support 58. The voltage applied across the pair of electrodes 44a,b capacitively couples energy to the process gas in the process zone 42. Typically, the voltage applied to the electrodes 44a,b is an alternating voltage which oscillates at a radio frequency. Generally, radio frequencies cover the range of from about 3 kHz to about 300 GHz. For the purposes of the present application, low radio frequencies are those which are less than about 1 MHz, and more preferably from about 100 KHz to 1 MHz (e.g., about 300 KHz). Also, for the purposes of the present application, high radio frequencies are those from about 3 MHz to about 60 MHz, and more preferably about 13.56 MHz. The selected radio frequency voltage is applied to the first electrode 44a at a power level of from about 10 W to about 1000 W, and the second electrode 44b is typically grounded. However, the particular radio frequency range that is used and the power level of the applied voltage depend on the type of material to be deposited.

The chamber 40 also comprises a gas exhaust 90 to remove spent process gas and byproducts from the chamber 40 and maintain a predetermined pressure of process gas in the process zone 42. In one version, the gas exhaust 90 includes a pumping channel 92 that receives spent process gas from the process zone 42, an exhaust port 94, a throttle valve 96, and one or more exhaust pumps 98 to control the pressure of process gas in the chamber 40. The exhaust pumps 98 may include one or more of a turbo-molecular pump, cryogenic pump, roughing pump, and combination-function pump that has more than one function. The chamber 40 may also comprise an inlet port or tube (not shown) through the bottom wall 56 of the chamber 40 to deliver a purging gas into the chamber 40. The purging gas typically flows upward from the inlet port past the substrate support 58 and to an annular pumping channel. The purging gas is used to protect surfaces of the substrate support 58 and other chamber components from undesired deposition during the processing. The purging gas may also be used to affect the flow of process gas in a desirable manner.

A controller 102 is also provided to control the operation and operating parameters of the chamber 40. The controller 102 may comprise, for example, a processor and memory. The processor executes chamber control software, such as a computer program stored in the memory. The memory may be a hard disk drive, read-only memory, flash memory or other types of memory. The controller 102 may also comprise other components, such as a floppy disk drive and a card rack. The card rack may contain a single-board computer, analog and digital input/output boards, interface boards and stepper motor controller boards. The chamber control software includes sets of instructions that dictate the timing, mixture of gases, chamber pressure, chamber temperature, microwave power levels, high frequency power levels, support position, and other parameters of a particular process.

The chamber 40 also comprises a power supply 104 to deliver power to various chamber components such as, for example, the first electrode 44a in the substrate support 58 and the second electrode 44b in the chamber 40. To deliver power to the process electrodes 44ab, the power supply 104 comprises a radio frequency voltage source that provides a voltage having the selected radio frequencies and the desired selectable power levels. The power supply 104 can include a single radio frequency voltage source, or multiple voltage sources that provide both high and low radio frequencies. The power supply 104 can also include an RF matching circuit. The power supply 104 can further comprise an electrostatic charging source to provide an electrostatic charge to an electrode often electrostatic chuck in the substrate support 58. When a heater 68 is used within the substrate support 58, the power supply 104 also includes a heater power source that provides an appropriate controllable voltage to the heater 68. When a DC bias is to be applied to the gas distributor 72 or the substrate support 58, the power supply 104 also includes a DC bias voltage source that is connected to a conducting metal portion of the faceplate 74 of the gas distributor 72. The power supply 104 can also include the source of power for other chamber components, e.g., motors and robots of the chamber 40.

The substrate processing chamber 40 also comprises a temperature sensor (not shown), such as a thermocouple or an interferometer, to detect the temperature of surfaces such as component surfaces or substrate 22 surfaces within the chamber 40. The temperature sensor is capable of relaying its data to the chamber controller 102 which can then use the temperature data to control the temperature of the processing chamber 40 by controlling the resistive heating element in the substrate support 58.

A passivation layer 20 comprising one or more of the dielectric layer 25, adhesion layer 27, and conformal liner 29 deposited by methods described below was found to be substantially absent defects, such as the seams which occurred at the bottom corners 30 in conventional deposition methods. Further, the passivation layer 20 deposited as a continuous and conformal coating over the complex-shaped, high aspect ratio features 26 such as the interconnect 13 as shown in FIG. 2A. Similarly, a passivation layer 20 deposited on connector bumps 14 also formed a smooth and continuous layer having a uniform thickness across the circular exposed surface 28 of the connector bump 14 as shown in FIG. 2B. Further, the bottom corners 30 around the base of the connector bumps 14 did not have any cracks or seams 16. Still another example of a passivation layer 20 deposited on high aspect ratio features 26, which include connector bumps 14 and silicon vias 18, is shown in FIG. 2C. Again, it was found that there were no crack defects at the bottom corners 30 in the interface of the connector bump 14 lying over the filled silicon via 18.

It is believed that the defects formed in conventional deposition processes occur due to thermal stresses at these regions which are caused by the thermal expansions of the features 24. High aspect ratio features 26 have a large dimensional change in the direction of the height, and further, there is a significant difference in dimensional change between the larger heights relative to the smaller widths of the features 24. It is further believed that the passivation layer 20 deposited by their current methods provided a conformal coating without defects because of higher density of the film, which is reflected in its refractive index and WERR ratios. Still further, it is also believed that the deposited passivation layers 20 were conformal even over the complex geometry of underlying features 24 such as the interconnect 13 or connector bump 14 because of the low sticking coefficients of the gaseous or plasma species generated in the various soaking, deposition and treatment, and conformal liner deposition processes.

Figure 5:
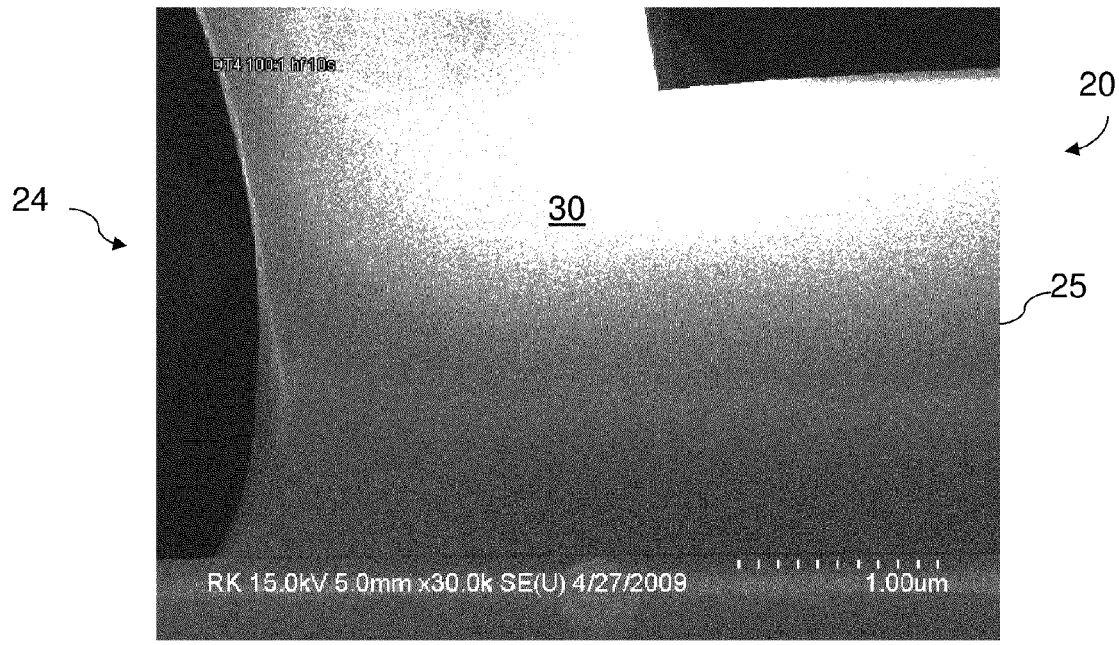
FIG. 5 is a scanning electron micrograph showing the absence of defects at the corner of the passivation layer of silicon nitride deposited over a high aspect ratio feature comprising a connector bump.

The following photographs demonstrate the lack of defects of passivation layers 20 comprising a dielectric layer 25 of silicon nitride deposited on features 24. For example, FIG. 5 is a scanning electron micrograph showing the absence of seams at the bottom corners 30 of a passivation layer 20 comprising a dielectric layer 25 of silicon nitride deposited over a feature 24 comprising a connector bump 14. Further, the SEM micrograph also shows a smooth and conformal profile of the passivation layer 20 which closely follows the contour of the cross-sectional profile of the underlying feature 24. In this example, the passivation layer 20 consists of a dielectric layer 25 of silicon nitride which was deposited at a deposition temperature of 400° C. Further, a multiple cycle deposition and treatment process was used to form the dielectric layer 25 of silicon nitride. In this example, 100 cycles of deposition plasma treatment were conducted to create the passivation layer 20.

As another example, FIG. 6 is a scanning electron micrograph showing the lack of seams along the bottom corners 30 of a passivation layer 20 consisting of silicon nitride that is deposited over of high aspect ratio feature 26 comprising copper bump. This photo further illustrates the passivation layer 20 were formed on the high aspect ratio feature 26 without defects. In this example, a dielectric layer 25 comprising nitride was deposited at a deposition temperature of 180° C. to provide a deposited layer having a high refractive index of higher than 1.88 as measured using ellipsometry at a wavelength of 633 nm.

In still another example, FIG. 7 shows a scanning electron micrograph of a high aspect ratio feature 26 comprising a copper bump with a passivation layer 20 comprising a dielectric layer 25 of silicon nitride. The silicon nitride layer was deposited at a deposition temperature of 180° C., and over a conformal liner 29 of silicon nitride having a thickness of 1000 Å. The SEM micrograph also shows a smooth and conformal profile of the passivation layer 20 closely following the cross-sectional profile of the underlying feature 24.

Thus, it is seen that a passivation layer 20 deposited by their current methods provided a conformal coating substantially without defects in corners and edges of the features 24 even when the features are high aspect ratio features 26. Still further, the deposited passivation layers 20 were conformal over the geometry of underlying features 24, such as the interconnect 13 or connector bump 14, having sharp or reentrant corners because of the better sticking coefficients of the gaseous plasma species formed in the plasma to deposit the silicon nitride layers of the passivation layer 20 as well as the other layers.

Although exemplary embodiments of the present invention are shown and described, those of ordinary skill in the art may devise other embodiments which incorporate the present invention and which are also within the scope of the present invention. Furthermore, the terms "below", "above", "bottom", "top", "up", "down", "first" and "second", and other relative or positional terms are shown with respect to the exemplary embodiments in the FIGS. and are interchangeable. Therefore, the appended claims should not be limited to the descriptions of the preferred versions, materials, or spatial arrangements described herein to illustrate the invention.

What is claimed is:

1. A method of forming a passivation layer on features of a substrate, the passivation layer comprising a silicon nitride layer, and the method comprising:
    (a) providing a substrate having a plurality of high aspect ratio features in a process zone, the high aspect ratio features comprising (i) interconnects or connector bumps, and (ii) a metal-containing material;
    (b) in an initial soaking stage, providing a soaking gas into the process zone to deposit a thin silicon nitride layer on the substrate, the soaking gas comprising silane, ammonia and nitrogen;
    (c) in a first stage, (i) forming in the process zone, a deposition gas comprising a silicon-containing gas and a nitrogen-containing gas by introducing a flow of the silicon-containing gas into the process zone and introducing a flow of the nitrogen-containing gas into the process zone, and (ii) energizing the deposition gas to deposit a silicon nitride layer on the features;
    (d) in a second stage, forming in the process zone, a treatment gas by stopping the flow of the silicon-containing gas while continuing the flow of the nitrogen-containing gas, and energizing the treatment gas to treat the silicon nitride layer; and
    (e) performing the first and second stages a plurality of times.

2. A method according to claim 1 wherein the silicon-containing gas comprises silane and the nitrogen-containing gas comprises ammonia and nitrogen.

3. A method according to claim 2 comprising providing a ratio of $SiH_4:NH_3:N_2$ of from about 1:1:8 to about 2:1:20.

4. A method according to claim 1 wherein (c) comprises setting process conditions to deposit a silicon nitride layer having a refractive index n that is less than 1.88, as measured using ellipsometry at a wavelength of 633 nm.

5. A method according to claim 1 wherein (c) comprises setting process conditions to deposit a silicon nitride layer having a wet etch rate ratio WERR of etching the passivation layer of silicon nitride relative to etching a thermal oxide layer that is less than 5.2.

6. A method according to claim 1 comprising maintaining the substrate at a temperature of from about 180° C. to about 550° C.

7. A method according to claim 1 wherein the high aspect ratio features further comprise any one of:
    (i) silicon vias; or
    (ii) oxide structures.

8. A method according to claim 1 comprising an initial cleaning stage comprising (i) providing a cleaning gas comprising a hydrogen-containing gas into the process zone, and (ii) energizing the cleaning gas to form an energized cleaning gas.

9. A method according to claim 8 wherein the hydrogen-containing gas comprises (i) $H_2$, (ii) $N_2$ and $NH_2$, (iii) $H_2O$, or (iv) $SiH_4$.

10. A method according to claim 8 wherein the cleaning gas is provided in a volumetric flow rate of from about 100 sccm to about 18 liters/minute.

11. A method according to claim 8 wherein the cleaning gas comprises:
    (1) $H_2$ in a volumetric flow rate of from about 500 to about 3000 sccm;
    (2) $NH_3$ in a volumetric flow rate of from about 50 to about 300 sccm and $N_2$ in a volumetric flow rate of from about 1000 L/min to 30,000 L/min; or
    (3) $H_2$ in a volumetric flow rate of from about 500 to about 3000 sccm and $NH_3$ in a volumetric flow rate of from about 50 to about 300 sccm.

12. A method according to claim 8 wherein the cleaning gas is energized by coupling RF energy to process electrodes which are about the process zone at a power of from about 50 to about 700 Watts.

13. A method according to claim 1 wherein the soaking stage comprises at least one of:
    (1) maintaining the substrate at a temperature of from about 100 to about 240° C.;
    (2) maintaining the soaking gas at a pressure of from about 1 to about 5 Torr; or
    (3) performing the soaking stage for from about 5 to about 30 seconds.

14. A method according to claim 1 wherein the soaking gas comprises silane in a volumetric flow rate of from about 200 to about 800 sccm, ammonia in a flow rate of from about 200 to about 800 sccm, and nitrogen in a flow rate of from about 4000 to about 12,000 sccm.

15. A method according to claim 1 comprising depositing a conformal liner on the features by:
    (1) introducing into the process zone, a liner gas comprising (i) $SiH_4$, $NH_3$ and $N_2$; (ii) trisilyamine, $NH_3$, and $N_2$; (iii) $SiH_4$ or $N_2$; or (iv) trisilyamine and a nitrogen-containing gas; and
    (2) energizing the liner gas to form a plasma to deposit a conformal liner on the features of the substrate, the conformal liner having a thickness greater than approximately 100 Å and a tensile stress of at least about 100 MPa.

16. A method according to claim 15 comprising depositing a conformal liner comprising a silicon nitride layer having a stress gradient through the thickness of the layer.

17. A method according to claim 15 comprising depositing a conformal liner by controlling the flow rate of $SiH_4$ from a high flow rate to a low flow rate during the deposition process, and changing the rate of applying RF power applied to a pair of process electrodes about the process zone.

18. A method according to claim 15 comprising depositing a liner comprising a plurality of discrete silicon nitride layers having different stress levels.

19. A method according to claim 15 comprising depositing a silicon nitride layer by sequentially depositing a silicon nitride layer and partially etching away the deposited silicon nitride layer.

20. A method according to claim 19 comprising etching away the deposited layer to change the reentrant profile at a bottom corner of the features.

21. A method according to claim 1 wherein the process zone comprises a pair of process electrodes, and wherein (c) comprises applying a first power level to the process electrodes, and thereafter, applying a second power level to the process electrodes, the second power level being higher than the first power level.

22. A method according to claim 21 wherein the second power level is at least about 100 Watts higher than the first power level.

23. A method of forming a passivation layer on features of a substrate, the passivation layer comprising a silicon nitride layer, and the method comprising:
(a) providing a substrate having a plurality of high aspect ratio features in a process zone, the high aspect ratio features comprising (i) interconnects or connector bumps, and (ii) a metal-containing material;
(b) in an initial soaking stage, providing a soaking gas into the process zone to deposit a thin silicon nitride layer on the substrate, the soaking gas comprising silane, ammonia and nitrogen;
(c) in a first stage, introducing into the process zone, a deposition gas comprising a silicon-containing gas and a nitrogen-containing gas and energizing the deposition gas to deposit the silicon nitride layer on the features of the substrate;
(d) in a second stage, introducing an etching gas into the process zone and energizing the etching gas to partially etch the deposited layer; and
(e) performing the first and second stages a plurality of times.

24. A method according to claim 23 wherein the etching gas comprises fluorine.

25. A method according to claim 24 wherein (d) comprises etching the silicon nitride layer to modify a reentrant profile of the silicon nitride layer at a bottom of corner of the features.

26. A method according to claim 23 wherein the process zone comprises a pair of process electrodes, and wherein (c) comprises applying a first power level to the process electrodes, and thereafter, applying a second power level to the process electrodes, the second power level being higher than the first power level.

27. A method according to claim 26 wherein the second power level is at least about 100 Watts higher than the first power level.

28. A method of forming a passivation layer on features of a substrate, the passivation layer comprising a silicon nitride layer and having a stress gradient through a thickness of the passivation layer, and the method comprising:
(a) providing a substrate having a plurality of high aspect ratio features in a process zone, the high aspect ratio features comprising (i) interconnects or connector bumps, and (ii) a metal-containing material;
(b) in an initial soaking stage, providing a soaking gas into the process zone to deposit a thin silicon nitride layer on the substrate, the soaking gas comprising silane, ammonia and nitrogen;
(c) introducing into the process zone, a first deposition gas comprising a silicon-containing gas and a nitrogen-containing gas, the first deposition gas having a first ratio of silicon-containing component to nitrogen-containing component;
(d) energizing the first deposition gas to deposit a first silicon nitride layer on the features of the substrate, which comprises a first ratio of silicon to nitrogen through the thickness of the layer;
(e) introducing into the process zone, a second deposition gas comprising a silicon-containing gas and a nitrogen-containing gas, the second deposition gas having a second ratio of silicon-containing component to nitrogen-containing component which is less than the first ratio; and
(f) energizing the second deposition gas to deposit a second silicon nitride layer on the features of the substrate, which comprises a second ratio of silicon to nitrogen through the thickness of the layer.

29. A method according to claim 28 wherein the first ratio is less than about 100:1 and the second ratio is at least about 1:1.

30. A method of forming a passivation layer on features of a substrate, the passivation layer comprising a silicon nitride layer and a stress gradient through a thickness of the layer, and the method comprising:
(a) providing a substrate having a plurality of features in a process zone;
(b) introducing into the process zone, a first deposition gas comprising a silicon-containing gas and a nitrogen-containing gas;
(c) energizing the first deposition gas by applying a first power level to a pair of process electrodes to deposit the silicon nitride layer on the features of the substrate;
(d) introducing into the process zone, a second deposition gas comprising a silicon-containing gas and a nitrogen-containing gas; and
(e) energizing the second deposition gas by applying a second power level to the pair of process electrodes, the second power level being higher than the first power level, to deposit the silicon nitride layer on the features of the substrate.

31. A method according to claim 30 wherein the second power level is at least about 100 Watts higher than the first power level.

32. A method according to claim 30 wherein the first power level is at least about 100 Watts and the second power level is at least about 500 Watts.

33. A method according to claim 30 wherein the silicon-containing gas comprises silane and the nitrogen-containing gas comprises ammonia and nitrogen.

34. A method according to claim 30 further comprising forming in the process zone, a treatment gas by stopping the flow of the silicon-containing gas while continuing the flow of the nitrogen-containing gas, and energizing the treatment gas to treat the silicon nitride layer.

35. A method according to claim 30 further comprising an initial soaking stage in which the substrate is maintained at a temperature while a soaking gas comprising silane is introduced into the process zone.

* * * * *